(12) United States Patent
Vice et al.

(10) Patent No.: US 8,301,091 B2
(45) Date of Patent: Oct. 30, 2012

(54) POWER DETECTOR FOR MULTI-BAND NETWORK ACCESS

(75) Inventors: Michael Wendell Vice, El Granada, CA (US); Henrik Morkner, Palo Alto, CA (US); Philip W. Fisher, Fort Collins, CO (US); Lan D. Nguyen, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 799 days.

(21) Appl. No.: 12/362,626

(22) Filed: Jan. 30, 2009

(65) Prior Publication Data

US 2010/0195547 A1 Aug. 5, 2010

(51) Int. Cl.
*H04B 1/02* (2006.01)
(52) U.S. Cl. ..................................... 455/127.3
(58) Field of Classification Search .............. 455/127.3; 385/147
See application file for complete search history.

(56) References Cited

U.S. PATENT DOCUMENTS

| | | | |
|---|---|---|---|
| 5,392,464 A * | 2/1995 | Pakonen | 455/115.1 |
| 5,781,051 A * | 7/1998 | Sandhu | 327/143 |
| 5,884,149 A * | 3/1999 | Jaakola | 455/103 |
| 6,018,650 A * | 1/2000 | Petsko et al. | 455/234.1 |
| 6,108,527 A * | 8/2000 | Urban et al. | 455/115.3 |
| 6,397,077 B1 * | 5/2002 | Jensen | 455/553.1 |
| 7,120,394 B2 | 10/2006 | Suzuki et al. | |
| 7,705,692 B2 * | 4/2010 | Fukamachi et al. | 333/109 |
| 2004/0075499 A1 * | 4/2004 | Dupuis et al. | 330/252 |
| 2006/0111059 A1 * | 5/2006 | Blosco et al. | 455/127.2 |
| 2006/0140573 A1 | 6/2006 | Kim | |
| 2006/0246858 A1 | 11/2006 | Boerman et al. | |
| 2007/0142014 A1 | 6/2007 | Wilcox | |
| 2007/0270110 A1 | 11/2007 | Smirnov et al. | |

* cited by examiner

*Primary Examiner* — Matthew Anderson
*Assistant Examiner* — Fatuma Sherif

(57) ABSTRACT

A device for interfacing with multiple different types of network access points includes multiple power amplifiers, a switch and a power detecting circuit. The power amplifiers are configured to provide corresponding signals associated with the different types of network access points, each signal having at least one parameter different than a corresponding parameter in another signal. The switch is configured to select one of the signals to provide an output signal. The power detecting circuit is configured to detect power of the output signal, and includes multiple states corresponding to the multiple different types of network access points. The power detecting circuit outputs a voltage level within the same voltage range for the signals in response to the multiple states corresponding to the different types of network access points with which the signals are associated.

17 Claims, 5 Drawing Sheets

POWER DETECTOR FOR MULTI-BAND NETWORK ACCESS

BACKGROUND

A variety of radio frequency (RF), microwave and millimeter wave power amplifiers operate in conjunction with power detectors, so that the power level produced by the respective power amplifiers can be monitored and automatically adjusted/corrected, as needed. Electronic devices, such as personal computers, laptop computers, portable game devices, personal digital organizers, and the like, which provide the capability of connecting with access points of communication networks, including wireless networks, typically include power amplifiers.

Access to different types of communications networks through network access points requires compliance with the associated standards, which typically have differing frequency bands, power levels and other parameters. Increasingly, the trend is to equip electronic devices with multi-band, multi-mode capability, so that connection to a network access point from the electronic device is possible regardless of the particular standard available. For example, a portable electronic device may include wireless internet access systems for respectively communicating over multiple networks having IEEE 802.11 (WiFi) and IEEE 802.16 (WiMax) standards. These standards provide for different access parameters, including different frequency bands and power ranges.

Wireless access front end modules (FEMs) are usually designed with numerous power amplifiers for transmitting data from the electronic device to the corresponding access points. A particular power amplifier is turned on when the electronic device attempts to connect with the corresponding access point, for example, depending on the wireless access standard available at the time/location.

A power amplifier for wireless access uplink transmission, for example, is fitted with a power detector that enables the access point to control the amount of power transmitted by the electronic device through a feedback loop, consistent with maintaining the integrity of the link and conserving the electronic device's battery life (e.g., for a portable electronic device). When multi-band operation requires multiple power amplifiers, each power amplifier is fitted with a corresponding power detector optimized for use in the frequency and power ranges covered by the respective power amplifier. The outputs of the multiple power detectors are then switched or wired together in such a way that a single power detector output is provided. Also, the outputs of the power amplifiers (e.g., corresponding amplified RF signals) are selectively output from the FEM through a switch.

While this conventional method matches power detectors with respective frequency and power ranges, performance suffers because the various detectors tend to have inconsistent operational characteristics, such as voltage offset, gain and compression, making accurate system calibration difficult. Further, compromises are made in terms of cost and size, due to the redundancy of the power detector circuitry.

For example, FIG. 1 is a block diagram depicting a conventional FEM 100 having multiple power detectors configured for operation in accordance with different communication standards.

FEM 100 includes power amplifiers 110 and 120, which correspond to different frequency bands and/or power levels of the different communication standards. For example, power amplifier 110 may correspond to a WiFi access point and power amplifier 120 may correspond to a WiMax access point. A switch 130 is used to select the output of one of the power amplifiers 110 or 120 to output a corresponding RF signal.

The power amplifier 110 is connected to a first power detector 114 through coupler 112. The power detector 114 is optimized for use in the frequency range covered by the power amplifier 110 (e.g., corresponding to a WiFi access point). The power amplifier 120 is connected to a second power detector 124 through coupler 122. The power detector 124 is optimized for use in the frequency range covered by the power amplifier 120 (e.g., corresponding to a WiMax access point). Also, the detector outputs Ndet1 and Ndet2 of the power detectors 114 and 124 may be switched or tied together, as discussed above. Redundant components are required for each of the power amplifiers 110, 120, as well as each of the power couplers 112, 122 and power detectors 114, 124.

SUMMARY

In a representative embodiment, a device for interfacing with different types of network access points includes multiple power amplifiers, a switch and a power detecting circuit. The power amplifiers are configured to provide corresponding signals associated with the different types of network access points, each signal having at least one parameter different than a corresponding parameter in another signal. The switch is configured to select one of the signals to provide an output signal. The power detecting circuit is configured to detect power of the output signal, the power detecting circuit including multiple states corresponding to the different types of network access points. The power detecting circuit outputs a voltage level within the same voltage range for the signals in response to the states corresponding to the different types of network access points with which the signals are associated.

In another representative embodiment, a device for interfacing with multiple network access points includes first and second power amplifiers, a signal switch, a power detector and a leveler. The first power amplifier is configured to provide a first amplified signal having a first signal parameter range corresponding to a first network access point. The second power amplifier is configured to provide a second amplified signal having a second signal parameter range corresponding to a second network access point, the second signal parameter range being different from the first signal parameter range. The signal switch is configured to select one of the first signal and the second signal. The power detector is connected to a coupler, which couples the selected signal to the power detector, the power detector being configured to detect power of the coupled signal and to output a detection voltage indicating the detected power. The leveler is configured to selectively amplify the coupled signal according to a first gain when the coupled signal includes the first signal parameter range and according to a second gain when the coupled signal includes the second parameter range. A power sensitivity of the power detector is equalized in accordance with the adjusted gain.

In another representative embodiment, a device equalizes power sensitivity of a power detector, the power detector being configured to receive multiple radio frequency (RF) signals from multiple power amplifiers having different frequency and power level ranges. The device includes an amplifier transistor, first and second switch transistors, and a driving transistor. The amplifier transistor includes a source connected to a coupler for receiving one of the RF signals, a drain connected to the power detector and a gate connected to a first node, the received RF signal having corresponding frequency and power level ranges. The first switch transistor includes a source connected to ground, a drain connected to the source of the amplifier transistor and a gate connected to a control voltage source for receiving a control voltage. The second switch transistor includes a source connected to ground and a drain connected to the first node and a gate. The driving transistor includes a source connected to ground, a drain connected to a high voltage source and the gate of the second switch transistor and a gate connected to the control voltage source. The first switch transistor is turned on in response to the control voltage having a high level, causing a gain of the amplifier transistor to decrease, and the second switch transistor is turned on in response to the control voltage having a low level, causing the gain of the amplifier transistor to increase.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Figure 2:
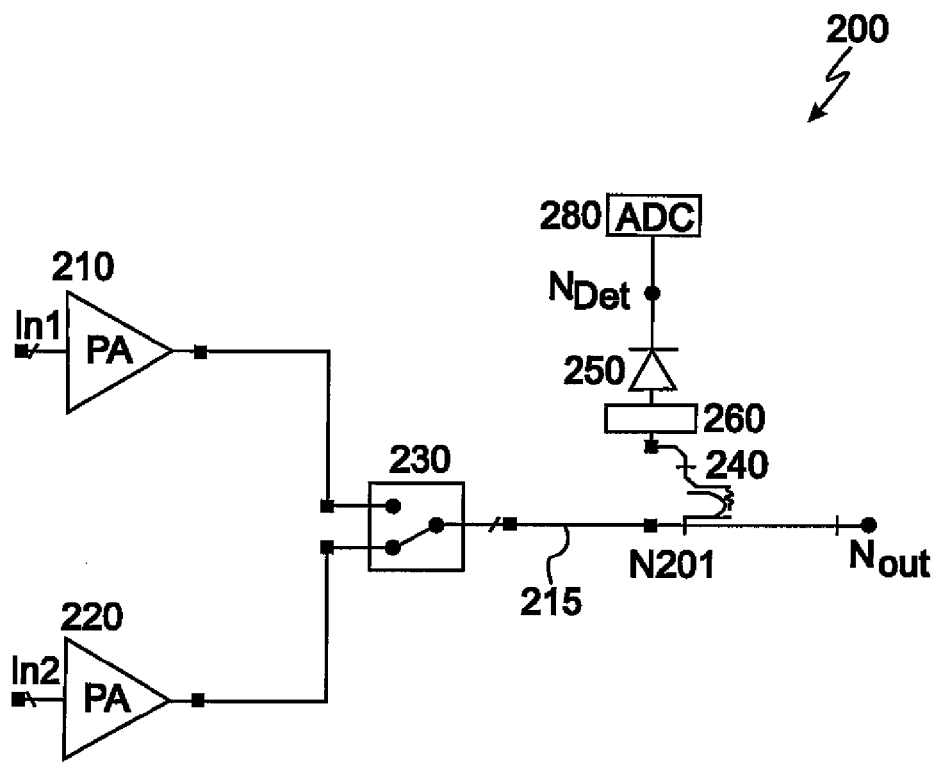
FIG. 2 is a block diagram illustrating a front end module of an electronic device having a single power detector, according to a representative embodiment.

FIG. 2 is a block diagram depicting a front end module (FEM) 200 for multi-band network access, according to a representative embodiment. The FEM 200 provides a compact, economical and performance consistent solution to power detection when multiple power amplifiers, such as power amplifiers 210 and 220, are used in a frequency and mode agile wireless access system. It is understood that FEM 200 may be provided within or otherwise connected to various types of electronic devices configured for communications over multiple networks, including laptop computers and other portable electronic devices, for example, which particularly benefit from higher integration, smaller size and lighter weight.

The FEM 200 includes power amplifiers 210 and 220, switch 230 and a power detecting circuit that includes coupler 240, power detector 250 and leveling circuit 260. The power amplifiers 210 and 220 amplify different signals (e.g., radio frequency (RF) signals), respectively having different signal parameters, including different frequency bands and different power levels, for communications based on different standards. For example, power amplifier 210 may correspond to an access point for wireless internet configured in accordance with the IEEE 802.11 (WiFi) communication standard for wireless access, and power amplifier 220 may correspond to another for wireless internet access point configured in accordance with the IEEE 802.16 (WiMax) communication standard for wireless access, the contents of which are hereby incorporated by reference. As stated above, each of these communication standards requires corresponding signal parameters, including frequency bands and power levels (e.g., as shown in Table 1, below), which are different from each other.

It is understood that the various embodiments are not limited to WiFi and/or WiMax operations, and are not limited to a signal power amplifier corresponding to each type of access point. The number of multiple power amplifiers and associated number and types of communication standards may vary to provide unique benefits for any particular situation or to meet application specific design requirements of various implementations, as would be apparent to one skilled in the art.

The FEM 200 outputs an amplified RF signal from one of the power amplifiers 210, 220 through output node Nout. The power amplifier 210 or 220 is selected through switch 230, which connects the selected one of the power amplifiers 210, 220 to switch node N201 in signal path 215. The coupler 240, located between the switch node N201 and the output node Nout, couples the RF signal to the power detector 250 through the leveling circuit 260. In various embodiments, the coupler 240 may be implemented as a directional coupler and the power detector 250 may be implemented as a diode (as shown), although it is understood that any alternative implementations of the coupler 240 and/or the power detector 250 may be included, without departing from the spirit and scope of the disclosure.

In order for the configuration of FEM 200 to function correctly, the correct response must be provided by the power detector 250 corresponding to each of the different types of signal parameters, such as frequency bands and power levels. For example, when WiFi and WiMax are being accommodated in the FEM 200, a high-band WiFi power amplifier (e.g., power amplifier 210) may operate in a first frequency range of 5.15-5.9 GHz and produce power levels in a first power range of 0-20 dBm, and a low-band WiMax power amplifier (e.g., power amplifier 220) may operate in a second frequency range from 2.3-2.7 GHz and produce power levels in a second power range of 6-26 dBm. The power amplifier 210 or 220 corresponding to the desired network access point (e.g., WiFi or WiMax, respectively) is selectively connected to output node Nout of the FEM 200 by the switch 230 to output a respective amplified RF signal. The output node Nout is connected to a broad band antenna system (not shown), although it is understood that any other means of transmitting output signals or otherwise communicating with the respective network access points may be provided.

In addition, the power detector 250 needs to provide substantially the same range of output voltages through detector output node Ndet for each of the power amplifiers 210 and 220 operating over their respective frequency ranges and power levels, for example. More particularly, the power detector 250 outputs a DC voltage through detector output node Ndet indicating detected power. The DC voltage is provided to an analog-to-digital converter (ADC) 280, for example, and is subsequently communicated to the corresponding network access point for processing and power adjustment (when needed), as discussed above. The ADC 280 operates within a predetermined voltage range. Therefore, the DC voltage output by the power detector 250 must be within this range, regardless of the frequency ranges, power levels and/or other parameters of the coupled RF signal detected by the power detector 250. For example, the coupler 240 may produce stronger coupling in response to higher RF signal frequencies, which would cause the detector 250 to produce higher DC voltages output from detector output node Ndet. Also, RF signals output from the power amplifiers 210, 220 having higher powers would likewise cause the detector 250 to produce higher DC voltages output from the detector output node Ndet. The higher DC voltages may potentially exceed the range of the ADC 280.

However, to prevent such variations in DC voltages output from the single power detector 250, e.g., in response to varying frequency, power ranges and/or other signal parameters, the leveling circuit 260 provides leveling operations corresponding to the respective power amplifiers 210, 220 and associated communication standards. For example, the leveling circuit 260 may provide an adjustable gain in order to increase or decrease power levels of coupled signals received from the coupler 240. More detail regarding leveling operations performed by the leveling circuit 260 is provided, for example, with reference to FIGS. 3 and 4, below.

Generally, the leveling circuit 260 is configured to selectively implement multiple states in response to the RF signals provided by the multiple power amplifiers 210, 220, respectively, and corresponding network communication standards. For example, in the representative embodiment depicted in FIG. 2, the leveling circuit 260 selectively provides one of two operational states corresponding to the two power amplifiers 210 and 220, e.g., depending on which power amplifier 210, 220 is connected through the switch 230. The two states of the leveling circuit 260 cause the power detector 250 to output DC voltages to the ADC 280 within the same range, thus equalizing power sensitivity of the power detector 250. In other words, the power detector 250 provides substantially the same voltage response for both frequency ranges, power level ranges and/or other signal parameters corresponding to the power amplifiers 210, 220.

Thus, in an embodiment, the coupler 240 enables the power detector 250 to sample available power from the power amplifier 210 or 220, which has been selectively connected to the output node Nout by the switch 230, e.g., irrespective of the load voltage standing wave ratio (VSWR). Also, in an embodiment, to reduce size and cost, the coupler 240 may be undersized, meaning that the coupler 240 is significantly shorter than a quarter wave length. When undersized, the coupler 240 has a high-pass function, such that coupling loss decreases with frequency. Multi-band operation therefore requires that the coupling slope of the coupler 240 be corrected to a flat response, which requires a low-pass filter between the coupler 240 and the power detector 250.

Figure 3:
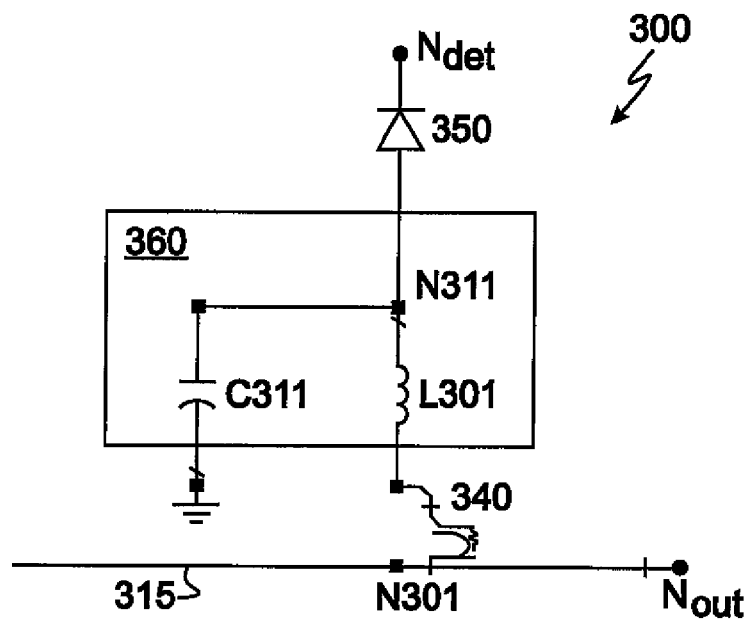
FIG. 3 is a block diagram illustrating a front end module of an electronic device having a single power detector, according to a representative embodiment.

FIG. 3 is a circuit diagram depicting FEM 300 having leveling circuit 360 for multi-band network access, according to a representative embodiment.

The leveling circuit 360 is connected between power detector 350 and coupler 340, which is connected between switch node N301 and output node Nout, of FEM 300. The switch node N301 selectively receives an RF signal from one of multiple power amplifiers through a switch (which are not shown in FIG. 3), as discussed above with respect to FEM 200 of FIG. 2. It is understood that the coupler 340, the power detector 350, the switch node 301 and the output node Nout may correspond to the coupler 240, the power detector 250, the switch node N201 and the output node Nout indicated in FIG. 2, respectively, and that the leveling circuit 360 is an example of the leveling circuit 260 depicted in FIG. 2.

In the depicted embodiment, the leveling circuit 360 is a low-pass filter, connected between the power detector 350 and the coupler 340. The low-pass filter includes capacitor C311, connected between node N311 and a low voltage source (e.g., hereinafter referred to as ground, for convenience of explanation), and inductor L301, connected between node N311 and the coupler 340. Node N311 is connected to the power detector 350, which is connected to the detector output node Ndet. The low-pass filter of the leveling circuit 360 thus corrects the coupling slope of the coupler 340 to a flat response, as discussed above.

Figure 4:
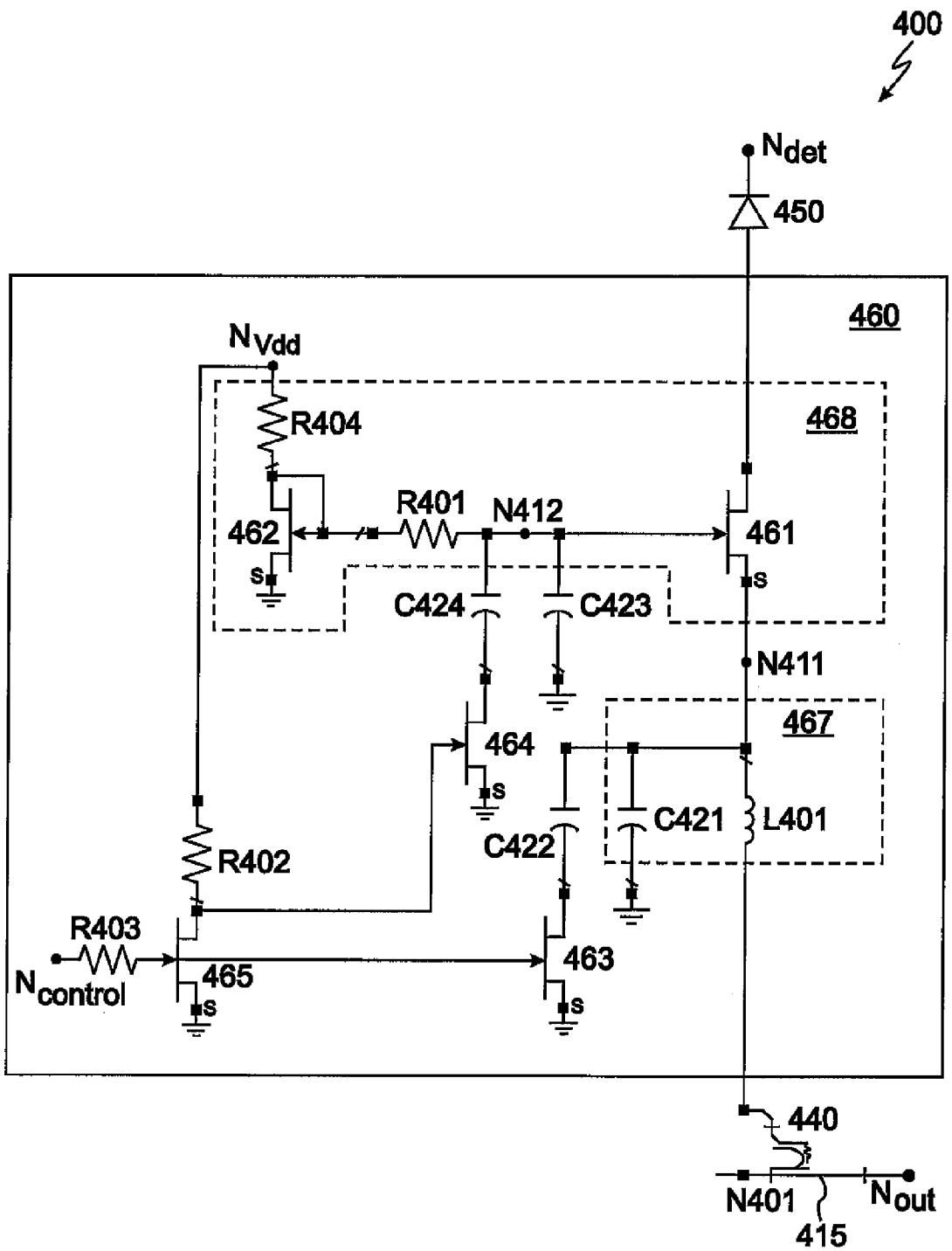
FIG. 4 is a block diagram illustrating a front end module of an electronic device having a single power detector, according to a representative embodiment.

In addition, as discussed above, power sensitivity of the power detector must be equalized between different applications (e.g., WiFi and WiMax applications), which may be accomplished by the circuitry of FIG. 4. FIG. 4 is a circuit diagram depicting FEM 400 having leveling circuit 460 for multi-band network access, according to another representative embodiment.

The leveling circuit 460 is connected between power detector 450 and coupler 440, which is connected between switch node N401 and output node Nout in the signal path 415 of FEM 400. The leveling circuit 460 is thus able to equalize power sensitivity between the multiple applications (e.g., WiFi and WiMax applications). More particularly, the switch node N401 selectively receives an amplified RF signal from one of multiple power amplifiers through a switch (which are not shown in FIG. 4), as discussed above with respect to power amplifiers 210, 220 and switch 230 in FEM 200 of FIG. 2. It is understood that the coupler 440, the power detector 450, the switch node 401 and the output node Nout may correspond to the coupler 240, the power detector 250, the switch node N201 and the output node Nout indicated in FIG. 2, respectively, and that the leveling circuit 460 is an example of the leveling circuit 260 depicted in FIG. 2.

The leveling circuit 460 includes a low-pass filter 467 connected to the coupler 440, a common gate amplifier transistor 461 connected between the low-pass filter 467 and the power detector 450, a current mirror 468, switch transistors 463 and 464, and driver transistor 465. The low-pass filter 467 may be optionally included in the leveling circuit 460, and is substantially the same as the low-pass filter discussed above with respect to leveling circuit 360 of FIG. 3. The low-pass filter 467 includes capacitor C421, connected between node N411 (connected to transistor 461) and ground, and inductor L401, connected between the node N411 and the coupler 440. The low-pass filter 467 thus changes the coupling slope of the coupler 440 to a flat response, as discussed above.

In the representative embodiment, transistor 461 includes a drain connected to the power detector 450 and a source connected to the node N411 to receive the coupled RF signal from the coupler 440 via low-pass filter 467. Transistor 461 also forms part of the current mirror 468, which further includes current mirror transistor 462, resistor R401 and resistor R404. Thus, a gate of transistor 461 is connected to a gate of transistor 462 through node N412 and resistor R401.

Thus, transistor 461 is gate-biased by the current mirror 468 and amplifies the coupled RF signal before it enters the power detector 450. The amount of amplification or gain by transistor 461 differs based on the state of the leveling circuit 460, which is selectively determined by the states of transistors 463-465, as discussed below. Also, the gate of transistor 461 is bypassed to ground in by bypass capacitor C423 and an additional bypass capacitor C424 may be selectively added to the circuit (e.g., by switch 464), as discussed below. It will be understood that drain bias means for biasing the drain of transistor 461 has been omitted for clarity.

Referring again to the current mirror 468, the gate of transistor 462 is connected to resistor R401, which is connected in series with node N412. Transistor 462 also includes a source connected to ground and a drain connected to resistor R401 and to resistor R404, which is connected in series with voltage source Vdd at voltage source node Nvdd.

Transistors 463 and 464 function as switches and are driven in complementary fashion by transistor 465 in response to a control signal Vc applied to control node Ncontrol. Transistor 463 has a source connected to ground, a drain connected to amplifier input bypass capacitor C422, and a gate connected to the control node Ncontrol (through resistor R403) and to a gate of transistor 465. Transistor 464 has a source connected to ground, a drain connected to node N412 (through capacitor C424) and a gate connected to a drain of transistor 465. Transistor 465 has a source connected to ground, a drain connected to the voltage source node Nvdd through resistor R402 and to the gate of transistor 464, and a gate connected to the control node Ncontrol (through resistor R403) and to the gate of transistor 463.

In this configuration, transistor 463 selectively couples capacitor C422 to node N411, which is the input to the amplifier (transistor 461), and transistor 464 selectively couples capacitor C424 to node N412, which is the gate of transistor 461. In particular, when control signal Vc is high, both transistors 463 and 465 are turned on. The drain of transistor 465 is pulled low, turning off transistor 464. The result is that capacitor C422 is switched in by transistor 463 (in the on-state) and capacitor C424 is switched out by transistor 464 (in the off-state). Accordingly, capacitor C422 helps to reduce gain by bypassing a portion of the coupled RF signal input through the coupler 440 to ground. Also, with capacitor C424 switched out, the gain of the amplifier (transistor 461) can be further reduced, e.g., by choosing a small value of capacitor C423, caused by insufficient gate bypassing on transistor 461. Reduced gain is the desired effect for WiMax applications, for example.

When control signal Vc is low, both transistors 463 and 465 are turned off. The drain of transistor 465 is therefore pulled high, turning on transistor 464. The result is that C422 is switched out by transistor 463 (in the off-state) and capacitor C424 is switched in by transistor 464 (in the on-state). This configuration causes the gain of the amplifier (transistor 461) to be higher, which is the desired effect for WiFi applications, for example, which operate at lower power levels than WiMax applications.

With respect to FIG. 4, transistors 461-465 may be field-effect transistors (FETs), such as gallium arsenide FETs (GaAsFETs), for example. However, other types of FETs and/or other types of transistors within the purview of one of ordinary skill in the art may be incorporated into the FEM 400, without departing from the spirit and scope of the present teachings. For example, transistors 461-465 may be other types of transistors, such as metal-oxide FETs (MOSFETs), silicon bipolar junction transistors (BJTs), high electron mobility transistors (HEMTs), pseudomorphic HEMTs, heterostructure FETs (HFETs), junction-gate FETs (JFETs), metal-semiconductor FETs (MESFETs), etc. Further, it is understood that the sources/drains of the various transistors may be reversed, without affecting the relevant functionality of the exemplary bias circuit 300, depending on design factors of various embodiments.

It is understood that the sizes of the various transistors 461-465, and the values of capacitors C421-C424, inductor L401 and resistors R401-R404 may vary to provide unique benefits for any particular situation or to meet application specific design requirements of various implementations, as would be apparent to one skilled in the art. For example, in an illustrative embodiment (assuming equal transistor lengths), transistor 461 may have a width of 35 µm, transistor 462 may have a width of 15 µm, transistor 463 may have a width of 100 µm, transistor 464 may have a width of 115 µm and transistor 465 may have a width of 25 µm. With respect to capacitance values, capacitor C421 may have a value of 0.8 pF, capacitor C422 may have a value of 1.2 pF, capacitor C423 may have a value of 0.5 pF and capacitor C424 may have a value of 1.6 pF. The inductor L401 may have a value of 1 nH. The resistance values of resistors R401-R404 may be determined in view of a variety of considerations, which would be apparent to one of skill in the art. Also, in the illustrative embodiment, the coupler 440 may have an electrical length of 0.033λ at 6 GHz of the RF signal and a coupling factor of −12.5 dB at the same frequency, for example.

Using the above illustrative values for the FEM 400 of FIG. 4, Table 1 provides a representative application scenario involving WiMax and WiFi standards for wireless access. The output levels of the power detector 450 at detector output node Ndet would be approximately 0.3V-0.9V over the power ranges set forth in Table 1.

TABLE 1

| Frequency | Power Range | Control Voltage Vc | IEEE Standard |
| --- | --- | --- | --- |
| 2.3-2.7 GHz | 6-26 dBm | High | WiMax |
| 2.4-2.5 GHz | 0-20 dBm | Low | WiFi |
| 3.3-3.8 GHz | 6-26 dBm | High | WiMax |
| 5.1-5.9 GHz | 0-20 dBm | Low | WiFi |

Figure 1:
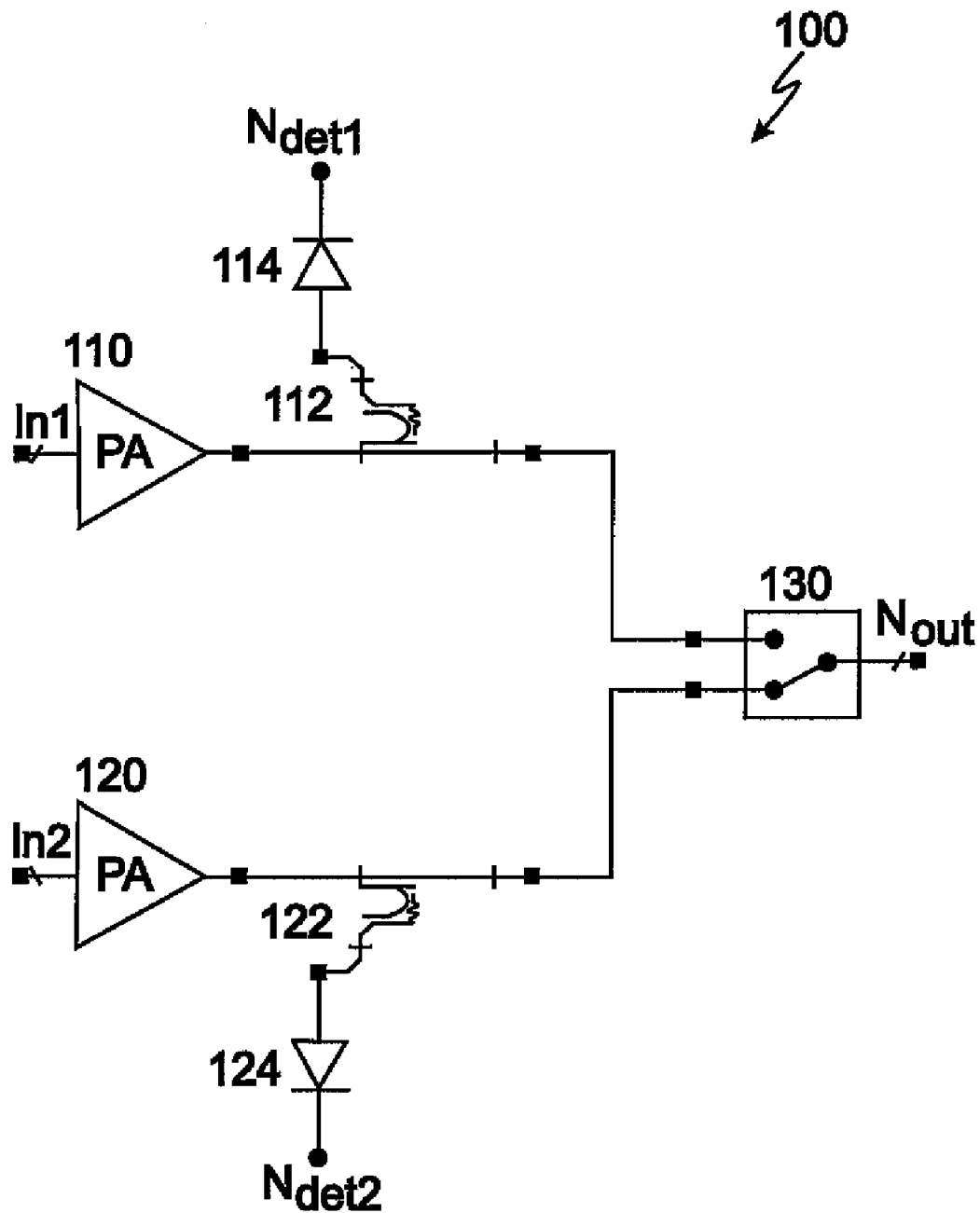
FIG. 1 is a block diagram illustrating a conventional front end module of an electronic device with multiple power detectors.

The depicted embodiments provide power detection in the single power detector circuit, which is capable of uniform offset, gain and compression over a variety of frequency bands and power levels, for example, associated with various communications standards, such as IEEE communications standards for wireless access. In comparison to conventional systems, which have multiple power detector circuits (e.g., power detector circuits 112 and 122 of FIG. 1) for corresponding multiple communication standards, the representative embodiments discussed above provide better performance at reduced cost and size.

Generally, FEMs 200-400 must maintain linearity when transmitting signals. Therefore, the respective power detectors should not introduce harmonic distortion into the transmitted signal stream. Since the level of harmonic distortion generated by a power detector is a function of the input signal level, the power detector may simply be operated at a sufficiently low signal level. When the power detector is fed from a directional coupler placed at the output of a power amplifier, the coupling factor may likewise be made sufficiently low to further limit power detector distortion and to lower the coupling of this distortion back into the main signal stream.

However, the output signal level of the power detector must be sufficiently large to be usable, e.g., minimizing effects of power detector offset error. Unfortunately, aside from the linearity problem mentioned above, the efficiency of the system is also degraded by operating the directional coupler with a high coupling factor in support of the need for high output signal level and offset suppression. This is because the directional coupler conserves energy. The more energy that is taken to feed the power detector, the more loss is provided to a main signal path. Hence, there exists a conflict between system linearity, efficiency and detector performance.

Figure 5:
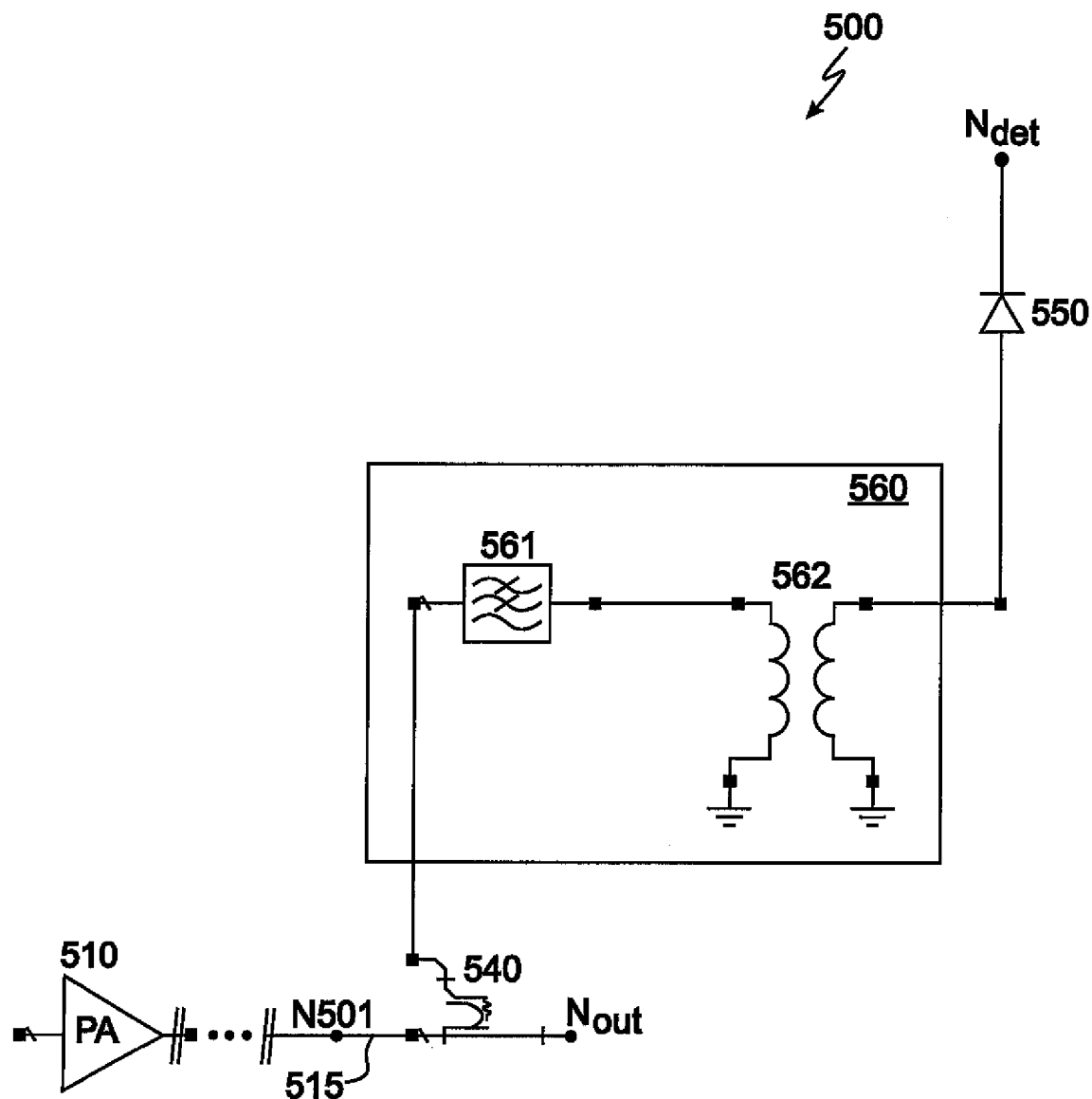
FIG. 5 is a block diagram illustrating a front end module of an electronic device, according to a representative embodiment.

FIG. 5 is a circuit diagram depicting FEM 500 having harmonic filter circuit 560, according to a representative embodiment. The harmonic filter circuit 560 minimizes power detector induced harmonic distortion, minimizes impact on efficiency, and maximizes power detector output level and offset suppression, without negative trade-offs.

More particularly, the harmonic filter circuit 560 is connected between power detector 550 and coupler 540, which is connected between switch node N501 and output node Nout, of FEM 500. The switch node N501 selectively receives an RF signal from one of multiple power amplifiers (e.g., represented by power amplifier 510) through a switch, as discussed above with respect to FEM 200 of FIG. 2. It is understood that the coupler 540, the power detector 550, the switch node 501 and the output node Nout may correspond to the coupler 240, the power detector 250, the switch node N201 and the output node Nout indicated in FIG. 2, respectively.

In alternative embodiments, the FEM 500 may include a harmonic filter circuit 560, as well as a coupler 540 and a power detector 550 for each single power amplifier (e.g., power amplifier 510). In other words, the embodiment shown in FIG. 5 is not necessarily limited to use for communications over multiple networks, or providing a signal power detector 550 for multiple power amplifiers.

In the depicted embodiment, the harmonic filter circuit 560 includes a low-pass filter 561 and an impedance transformer 562 connected in series between the power detector 550 and the coupler 540. The low-pass filter 561 may be a low-pass Butterworth filter, for example. In various embodiments, the harmonic filter circuit 560 may be connected directly to both the power detector 550 and the coupler 540, as shown, or when combined with the previously discussed embodiments, the harmonic filter circuit 560 may be connected between a leveling circuit (e.g., leveling circuit 460 of FIG. 4) and the coupler 540. Also, in various embodiments, the harmonic filter circuit 560 may be used in place of the low-pass filter included within the leveling circuit (e.g., low-pass filter 467 in leveling circuit 460 of FIG. 4).

The low-pass filter 561 prevents harmonics of the RF signal produced by non-linearity in the power detector 550 from back-washing through the (directional) coupler 540 and into the main signal path 515 to output node Nout. With the harmonics sufficiently suppressed, the power detector 550 may be operated at the desired signal level with the appropriate linearity. The impedance transformer 562 provides the necessary signal voltage to the power detector 550, considering available power. In other words, the impedance transformer 562 is used to determine a voltage level of the RF signal reaching the power detector 550 after the coupling factor of the coupler 540 has been set low enough to prevent undue coupler main path loss. Since the output load condition for the power detector 550 is typically several thousand ohms, transformation by the impedance transformer 562 to impedance higher than 50 ohms, for example, is not a problem.

Notably, the functions of the low-pass filter 561 and the impedance transformer 562 do not need to be implemented sequentially, as depicted. Also, the low-pass filter 561 and the impedance transformer 562 may be implemented separately or within the same hardware. Also, in an embodiment, the harmonic filter circuit 560 may be designed having only the low-pass filter 561, and still obtain the required impedance transformation (without impedance transformer 562), as well as filtration.

The harmonic filter circuit 560 is designed based on operational criteria of the coupler 540 and the power detector 550. For example, to properly fit the harmonic filter circuit 560 to the FEM 500, the following information regarding operation of the coupler 540 and the power detector 550 are determined: (i) the maximum coupling factor of the coupler 540 consistent with the required throughput efficiency for the coupler 540 (i.e., when the coupler 540 is used to feed the power detector 550); (ii) the signal level available to the power detector 550; (iii) the signal level required from the power detector 550 for operation of subsequent circuitry and for adequate suppression of detector offset; (iv) the signal voltage level required at the input of the power detector 550 to produce the required output level from Ndet; (v) the harmonic levels emerging from the input of the power detector 550 when driven to the required signal voltage level; and (vi) the maximum harmonic level that can flow back into the coupler 540 (or signal source) consistent with system harmonic suppression requirements.

With this information, the harmonic filter circuit 560 may be designed as an impedance transforming filter or cascaded filter-transformer (shown in FIG. 5) that provides required harmonic insertion loss based on the previously determined harmonic levels emerging from the input of the power detector 550 (determination (v)) and the previously determined maximum harmonic level (determination (vi)), discussed above. Further, an impedance transforming ratio may be designed such that the determined signal voltage level required by the power detector 550 (determination (iv) is realized.

Accordingly, the coupling loss imposed on the main signal path 515 is acceptably low and the output level of the power detector 550 is acceptably high. Also, backwash of the harmonic distortion, generated by the power detector 550, into the main signal path 515 is suppressed.

In addition, it is known that directional couplers may provide some loss (isolation), which helps to prevent distortion produced by corresponding power detectors from entering the main signal path. However, the isolation inherently provided by couplers may not always be sufficient, particularly for highly sensitive power detectors, and a compromise exists between the opposing requirements of spectral purity and power detector sensitivity. That is, when a power detector is sufficiently insensitive, the coupling in the coupler is too great to protect adequately from spectral impurities generated by the power detector. Further, an impedance mismatch may occur between the coupler (e.g., 50 ohms) and the high impedance environment of the power detector circuit and its load (e.g. several thousand ohms). The power detector tends to produce a large voltage, while the coupler is a low impedance circuit that produces relatively low voltages.

Figure 6:
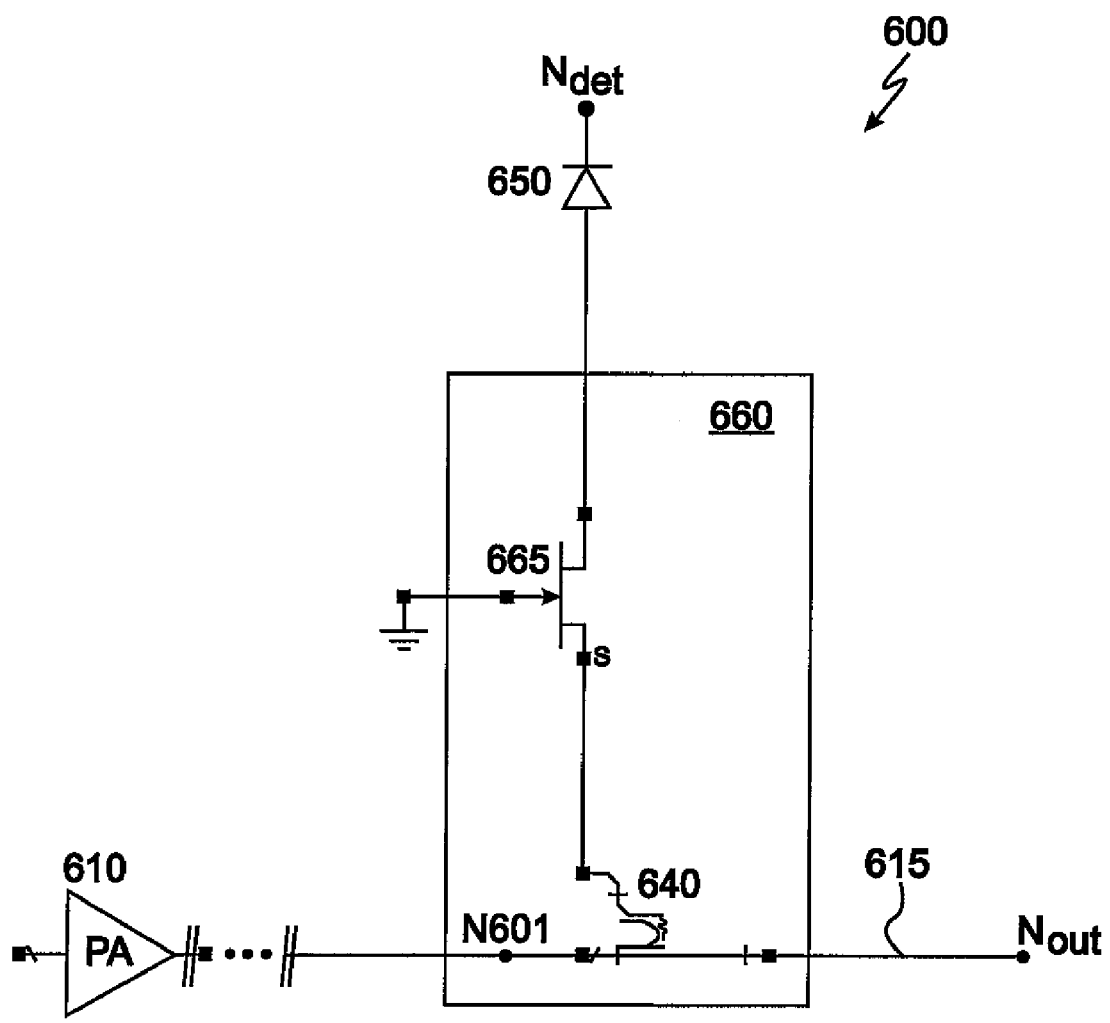
FIG. 6 is a block diagram illustrating a front end module of an electronic device, according to a representative embodiment.

In light of these issues, FIG. 6 is a circuit diagram depicting FEM 600 having a coupler circuit 660, according to a representative embodiment.

The coupler circuit 660 includes directional coupler 640 and common gate amplifier transistor 665, connected in series between power detector 650 and node N601 in the main signal path 615. The coupler circuit 660 provides low loss coupling between a power amplifier (e.g., power amplifier 610) and power detector 650, while providing a high degree of reverse isolation from the detector back into the RF power stream in signal path 615.

More particularly, the coupler circuit 660 is connected between the power detector 650 and the switch node N601/output node Nout of FEM 600. The switch node N601 selectively receives an RF signal from one of multiple power amplifiers through a switch (which are not shown in FIG. 6), as discussed above with respect to FEM 200 of FIG. 2, for example. It is understood that the coupler 640, the power detector 650, the switch node 601 and the output node Nout may correspond to the coupler 240, the power detector 250, the switch node N201 and the output node Nout indicated in FIG. 2, respectively.

Transistor 665 includes a gate connected to AC ground, a drain connected to the power detector 650 and a source connected to the coupler 640. It will be understood that DC bias considerations have been omitted for clarity. The coupler 640 thus couples the RF signal to the input (source) of the transistor 665. The input impedance of transistor 665 (e.g., configured as a common gate amplifier) is relatively low and is therefore easily matched to the output impedance of the coupler 640. The output impedance of transistor 665 is relatively high and is therefore suitable for driving the power detector 650. Further, high degree of reverse isolation of transistor 665 is utilized to prevent non-linearity products of the power detector 650 from reaching the main signal path 615. The gain and output impedance of transistor 665 provide sufficient voltage amplitude for attainment of required sensitivity of the power detector 650.

In various embodiments, transistor 665 may be connected directly to both the power detector 650 and the coupler 640, as shown, or when combined with the previously discussed embodiments, transistor 665 may be connected between a leveling circuit (e.g., leveling circuit 460 of FIG. 4) and the coupler 640. Also, in various embodiments, the entire coupler circuit 660 may be used in place of the coupler (e.g., coupler 440 of FIG. 4). Or, in various embodiments, a low-pass filter (e.g., low-pass filter 467 of FIG. 4) may be included within the coupler circuit 660 between the coupler 640 and transistor 665, either with or without a leveling circuit (e.g., leveling circuit 460 of FIG. 4).

Accordingly, transistor 665 is configured to provide a high degree of reverse isolation, and to provide the desired impedance transformation and gain needed to keep sensitivity of the power detector 650 high. Also, transistor 665 provides a high degree of reflection linearity, so that it does not backwash spectral impurities into the RF signal in the main signal path 615.

Although FIG. 6 depicts transistor 665 as a FET, such as a GaAsFET, for example, it is understood that other types of FETs and/or other types of transistors within the purview of one of ordinary skill in the art may be incorporated into the FEM 600, including a bipolar transistor, such as a BJT, without departing from the spirit and scope of the present teachings. For example, transistor 665 may additionally comprise a MOSFET, an HEMT, a pseudomorphic HEMT, an HFET, a JFET, a MESFET, etc. Further, it is understood that the sources/drains of transistor 665 may be reversed, without affecting the relevant functionality of the exemplary bias circuit 600, depending on design factors of various embodiments. In yet another embodiment, the coupler 640 may be replaced by a generalized coupling network.

In alternative embodiments, the FEM 600 may include a common gate amplifier transistor 665, as well as a coupler 640 and a power detector 650 for each single power amplifier (e.g., power amplifier 610). In other words, the embodiment shown in FIG. 6 is not necessarily limited to use in communications over multiple networks, or providing a signal power detector 650 for multiple power amplifiers.

In view of this disclosure it is noted that variant circuits can be implemented in keeping with the present teachings. Further, the various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A device for interfacing with a plurality of different types of network access points, the device comprising:
a plurality of power amplifiers configured to provide a corresponding plurality of signals associated with the different types of network access points, each signal having at least one parameter different than a corresponding parameter in another signal;
a switch configured to select one of the plurality of signals to provide an output signal at a signal output node;
a power detecting circuit configured detect power of the output signal, the power detecting circuit comprising a plurality of states corresponding to the plurality of different types of network access points, wherein the power detecting circuit outputs a voltage level at a detector output within the same voltage range for the plurality of signals in response to the plurality of states corresponding to the different types of network access points with which the plurality of signals are associated; and
a coupler located between the switch and the signal output node and configured to couple the selected one of the plurality of signals to the power detector,
wherein the power detecting circuit comprises:
a power detector configured to output the voltage level; and
a leveler connected between the coupler and the power detector, the leveler comprising the plurality of states corresponding to the plurality of different types of network access points, wherein the leveler is configured to select one of the plurality of states in response to a control signal, and wherein the leveler comprises an amplifier, the plurality of states corresponding to a plurality of selectable gains of the amplifier.

2. The device of claim 1, wherein the power detecting circuit further comprises: a low-pass filter connected between the coupler and the leveler to filter the coupled output signal.

3. A device for interfacing with a plurality of network access points, the device comprising:
a first power amplifier configured to provide a first amplified signal comprising a first signal parameter range corresponding to a first network access point;
a second power amplifier configured to provide a second amplified signal comprising a second signal parameter range corresponding to a second network access point, the second signal parameter range being different from the first signal parameter range;
a signal switch configured to select one of the first signal and the second signal as an output signal at an output node;
a coupler located between the switch and the output node;
a power detector connected to the coupler, which couples the selected signal to the power detector, the power detector being configured to detect power of the coupled signal and to output a detection voltage indicating the detected power; and
a leveler configured to selectively amplify the coupled signal according to a first gain when the coupled signal includes the first signal parameter range and according to a second gain when the coupled signal includes the second parameter range, a power sensitivity of the power detector being equalized in accordance with the adjusted gain;
wherein the leveler comprises:
an amplifying transistor configured to receive and amplify the coupled signal;
a first switch configured to selectively connect an input of the amplifying transistor to ground when the first switch is in an on-state, causing the amplifying transistor to amplify the coupled signal according to the first gain; and
a second switch configured to selectively connect a gate of the amplifying transistor to ground when the second switch is in an on-state, causing the amplifying transistor to amplify the coupled signal according to the second gain, the second gain being greater than the first gain.

4. The device of claim 3, wherein the first signal parameter range comprises a first frequency range and the second signal parameter range comprises a second frequency range.

5. The device of claim 3, wherein the first signal parameter range comprises a first power level range and the second signal parameter range comprises a second power level range.

6. The device of claim 3, wherein the leveler further comprises:
a driver configured to control the first and second switches to opposite states in response to a control voltage.

7. The device of claim 6, wherein the leveler further comprises:
a current mirror connected to the gate of the amplifying transistor to bias the amplifying transistor.

8. The device of claim 7, further comprising:
a low-pass filter connected between the coupler and the leveler to filter the coupled signal, the low-pass filter changing a coupling slope of the coupler to a flat response.

9. A device for equalizing power sensitivity of a power detector, the power detector being configured to receive via a coupler a selected one of a plurality of radio frequency (RF) signals from a plurality of power amplifiers having a plurality of different frequency and power level ranges, the device comprising:
an amplifier transistor comprising a source connected to the coupler for receiving the coupled selected one of the plurality of RF signals, a drain connected to the power detector and a gate connected to a first node, the received RF signal having corresponding frequency and power level ranges, the amplifier transistor being configured to amplify the coupled selected one of the plurality of RF signals;
a first switch transistor comprising a source connected to ground, a drain connected to the source of the amplifier transistor and a gate connected to a control voltage source for receiving a control voltage;
a second switch transistor comprising a source connected to ground and a drain connected to the first node and a gate; and
a driving transistor comprising a source connected to ground, a drain connected to a high voltage source and the gate of the second switch transistor and a gate connected to the control voltage source,
wherein the first switch transistor is turned on in response to the control voltage having a high level, causing a gain of the amplifier transistor to decrease, and
wherein the second switch transistor is turned on in response to the control voltage having a low level, causing the gain of the amplifier transistor to increase.

10. The device of claim 9, wherein the second switch transistor is turned off in response to the control voltage having the high level and the first switch transistor is turned off in response to the control voltage having the low level.

11. The device of claim 10, wherein the control voltage is set to one of the high level or the low level based on at least one of the frequency range and the power level range corresponding to the received RF signal.

12. The device of claim 11, wherein an output voltage range of the power detector is substantially the same when the control voltage is set to either the high level or the low level.

13. The device of claim 10, further comprising:
a current mirror transistor comprising a source connected to ground, a drain connected to the high voltage source and a gate connected to the first node, the current mirror transistor biasing the gate of the amplifier transistor.

14. The device of claim 9, further comprising:
a low-pass filter connected between the amplifier transistor and the coupler, the low-pass filter comprising an inductor connected between the amplifier transistor and the coupler and a capacitor connected between the amplifier transistor and ground.

15. The device of claim 14, wherein the low-pass filter changes a coupling slope of the coupler to a flat response.

16. The device of claim 9, further comprising:
a first capacitor connected between the drain of the first switch transistor and the amplifier transistor, the first capacitor reducing the gain of the amplifier transistor when the first switch transistor is turned on by bypassing a portion of the received RF signal to ground.

17. The device of claim 16, further comprising:
a second capacitor connected between the drain of the second switch transistor and the first node, the second capacitor increasing the gain of the amplifier transistor when the second switch transistor is turned on by bypassing the gate of the amplifier transistor to ground.

* * * * *